United States Patent [19]

Hynecek

[11] Patent Number: 4,668,971
[45] Date of Patent: May 26, 1987

[54] CCD IMAGER WITH JFET PERIPHERALS

[75] Inventor: Jaroslav Hynecek, Richardson, Tex.

[73] Assignee: Texas Instruments Incorporated, Dallas, Tex.

[21] Appl. No.: 770,337

[22] Filed: Aug. 27, 1985

[51] Int. Cl.$^4$ .................... H01L 29/78; H01L 27/14; H01L 31/00; G11C 19/28

[52] U.S. Cl. ........................ 357/24; 357/22; 357/30; 357/91; 377/60; 377/62

[58] Field of Search ............... 357/22, 24, 30, 91; 377/57-63

[56] References Cited

U.S. PATENT DOCUMENTS

| | | | |
|---|---|---|---|
| 4,032,952 | 6/1977 | Ohba et al. | 357/24 M |
| 4,229,752 | 10/1980 | Hynecek | 357/24 M |
| 4,513,313 | 4/1985 | Kinoshita et al. | 357/24 LR |

OTHER PUBLICATIONS

Dawson et al., "A CMOS/Buried-N-Channel CCD Compatible Process for Analog Signal Processing Applications", RCA Review, vol. 38 (9/77), pp. 406-435.

*Primary Examiner*—Gene M. Munson
*Attorney, Agent, or Firm*—Richard A. Bachand; N. Rhys Merrett; Melvin Sharp

[57] ABSTRACT

A CCD imager wherein a mixed MOSFET and JFET periphery is provided using the same device doping profiles as are used for fabrication of the CCD structure. This provides simple fabrication of low-noise amplifiers integrated with the CCD array. Preferably the gate of the JFET is formed with the same implant which forms the virtual phase electrode in an array of virtual phase CCD cells. Preferably the JFETs are used as loads in source-follower stages. Preferably the MOSFET devices include both buried-channel and surface-channel devices connected to a common drain voltage; the buried-channel devices are used for earlier stages of amplification, where they can be operated in their low-noise regime, and the surface channel used for output stages. If buried channel devices were used for the output stage, then the buried-channel devices in the prior stage would have to be biased into a high-noise regime to achieve the necessary output voltage swings.

10 Claims, 19 Drawing Figures

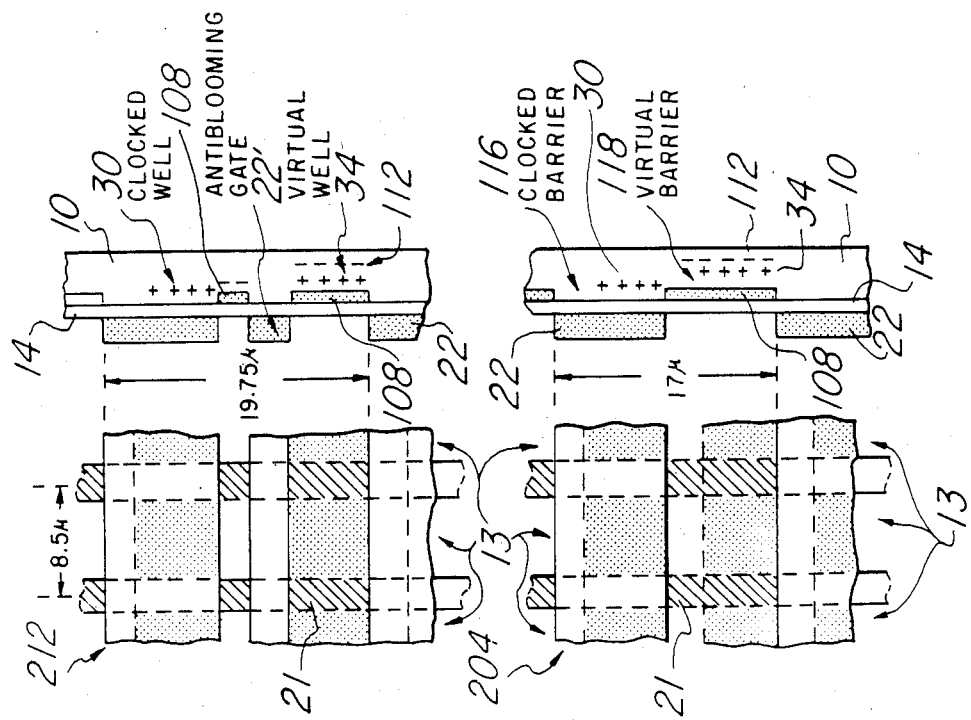
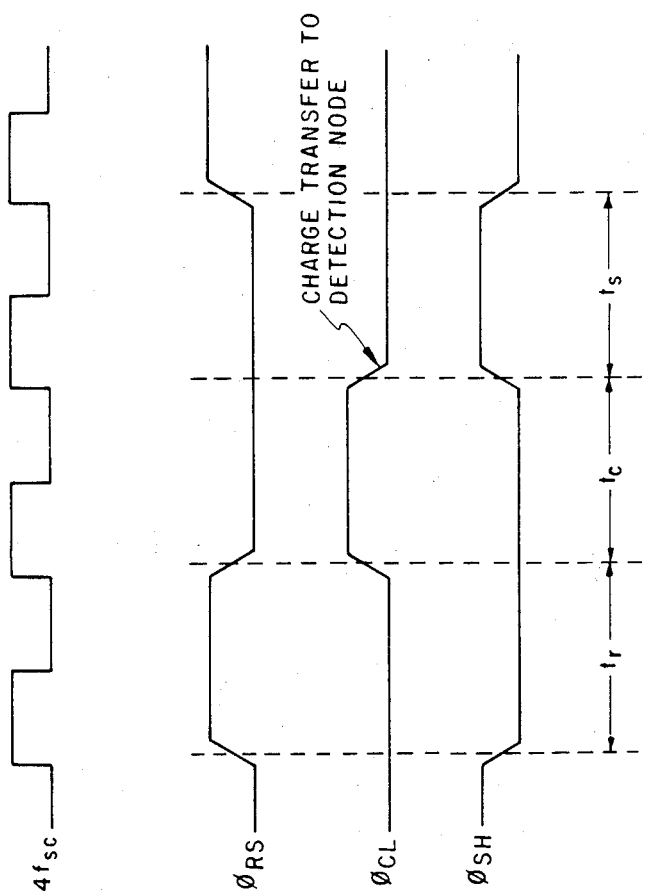
Fig. 2
Fig. 1b

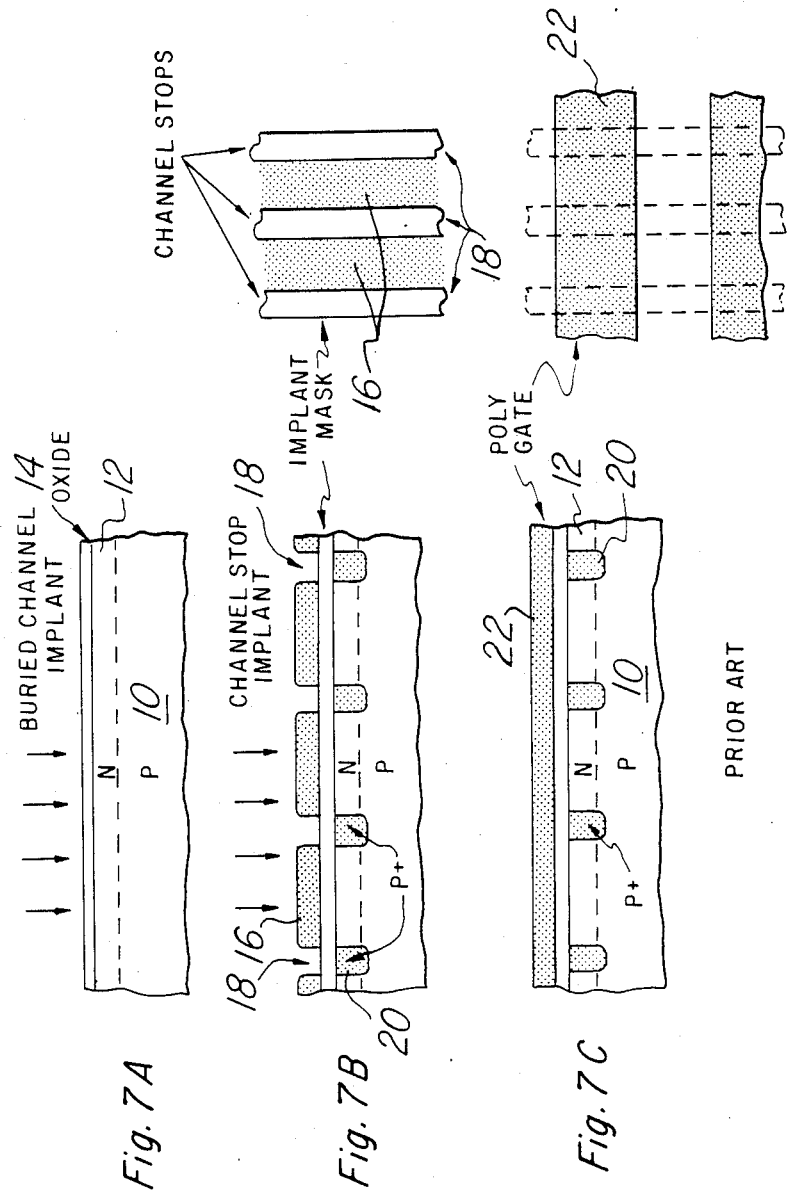

CCD IMAGER WITH JFET PERIPHERALS

CROSS-REFERENCE TO RELATED APPLICATIONS

The following patent applications, assigned to the assignee hereof contain related subject matter, and all are hereby incorporated by reference:
Ser. No. 770,323 filed Aug. 27, 1985;
Ser. No. 770,325 filed Aug. 27, 1985;
Ser. No. 770,111 filed Aug. 27, 1985;
Ser. No. 770,322 filed Aug. 27, 1985;
Ser. No. 770,112 filed Aug. 27, 1985;
Ser. No. 770,326 filed Aug. 27, 1986.

BACKGROUND AND SUMMARY OF THE INVENTION

The present invention relates to CCD structures, and particularly to CCD imagers.

The level of peripherals normally integrated with CCD imagers in the prior art has been quite primitive. This has presumably been due to the special processing requirements of the CCD imagers. Typically logic and driver circuitry has been constructed off chip, as has all but the most rudimentary of sense amplifiers. It is necessary to have some sort of sense amplifier on-chip, but the prior art has frequently used only a single source follower stage, or perhaps two source follower stages, to get a signal adequate to send to a more sophisticated amplifier off chip.

This processing-driven limitation has prevented development of "smart" CCD devices, and also in general retarded the general performance of CCD devices by restricting the signal-to-noise ratio improvements which could be attained by on-chip processing.

The present invention remedies this shortcoming in two ways.

First, the present invention provides a device structure, wherein JFET peripherals are provided with the same doping profile as is used to build (for example) a virtual phase CCD electrode.

Second, the present invention also provides a peripheral device configuration wherein both buried-channel and surface-channel MOSFETs, with a common drain supply voltage, are used.

Buried-channel MOSFETs give good low-noise performance, but only as long as their drain voltage is kept sufficiently low. A plot of noise spectral density at 200 kilohertz vs. drain voltage can be seen in FIG. 9a, on page 1718, of the article "Design and Performance of a Low-Noise Charge-Detection Amplifier for VPCCD Devices" by J. Hynecek, at page 1713 of the December, 1984 issue of the IEEE Transactions on Electron Devices, Vol. ED-31, which is hereby incorporated by reference.

When a buried-channel device is biased above saturation, hot electrons are believed to be generated in the channel, and will produce additional electron-hole pairs through impact ionization. In a buried-channel transistor, some of the generated holes will be confined in the potential well between the bulk channel and the silicon-silicon dioxide interface. The holes must then travel along the interface from the drain region to the vicinity of the source and finally to the substrate or along the side of the gate to the channel stops. If enough holes accumulate at the interface, the threshold voltage of the transistor will shift, and a drain current increase will be observed. This phenomenon becomes more acute as transistor gate width is increased, and it is also exacerbated by the potential barriers for holes which sometimes exist at the edge of the buried channel next to the thick field oxide region.

To avoid this noise problem of buried-channel devices, while retaining the good low-noise small-signal characteristics of such devices, the present invention teaches combination of surface-channel MOS transistors with buried-channel MOS transistors in CCD peripherals. The surface-channel transistor can be correctly biased for high output current levels by the levels provided from preceding low-noise buried-channel stages, using a common drain supply voltage (VDD) for both surface-channel and buried-channel devices. That is, the surface-channel MOS output stage permits the use of low-noise buried channel devices in the preceding stages, but avoids the necessity of biasing the buried-channel transistors into their high-noise regime for driving the output stage. The combination of the buried-channel and surface-channel transistors thus offers lower drain bias requirements, lower power consumption, lower output DC voltage, and, most importantly, superior noise performance.

A further advantage of the preferred embodiment of the present invention is that both the buried-channel and surface-channel MOSFET devices are provided in a CCD process using no more masks than would be required to fabricate an MOS peripheral in any case.

In the most preferred embodiment of the present invention, the peripherals include JFETs and buried-channel MOSFETS and surface-channel MOSFETS. For example, in a sense amplifier having multiple source follower stages (as is commonly used), a buried-channel MOSFET with a JFET load can be used as the first-stage source follower, and a surface-channel MOSFET with a JFET load can be used as the output stage source follower.

Integration of these peripheral structures with virtual phase CCD technology is particularly convenient, but the present invention is also applicable to other CCD technologies, although it may not be as advantageous in every case.

In virtual phase technology the virtual electrode (which is a diffused electrode) provides an implant profile which can also be patterned in the periphery to provide JFET gates. Moreover, the well implants provide appropriate implant profiles for LDD (lightly-doped-drain-extension) regions which are self-aligned to the poly gate of an MOS transistor. Moreover, the channel implant used in the preferred version of virtual phase CCD array fabrication can be patterned to define separate surface-channel and buried-channel devices.

A further class of embodiments of the present invention provides two types of JFETs: both high-pinchoff ($V_p>3$ V) and low-pinchoff ($V_p<3$ V) devices are provided without use of any additional masking steps besides those already required for fabrication of the CCD array. This is advantageous since it gives the designer more options, particularly in designing low-noise circuits. In particular, high-pinchoff JFETs have a lower noise figure than low-pinchoff devices, so it may be advantageous to use the high-pinchoff devices for small-signal amplifier stages. High-pinchoff devices will pass much more current for a given geometry than low-pinchoff devices will, so the most advantageous configuration is to use both high-pinchoff and also low-pinchoff JFETs. An even more advantageous configuration is to use both high-pinchoff and also low-pinchoff JFETs together with both buried-channel and surface channel MOSFETs.

The use of JFETs and buried-channel MOSFETS and surface-channel MOSFETs is thus particularly convenient with virtual phase technology. However, it would also be convenient with any other CCD technology which used both one or more insulated-gate-electrode phases and also one or more diffused-gate-phases.

The use of both buried-channel and surface-channel MOSFETs is particularly convenient with virtual phase technology, but would also be advantageous with any other CCD technology which used a patterned shallow implant (p-type or n-type) during fabrication of the CCD array.

According to the present invention there is provided: A CCD device comprising: a substrate having a p-type crystalline semiconductor upper portion containing a plurality of CCD elements connected in series, each said CCD element comprising an insulated-gate phase portion and a diffused-gate phase portion, each of said insulated gate phase portions and each of said diffused-gate phase portions including both a well region and a barrier region, said well regions of said diffused-gate phase portions comprising both an n-type channel region and a shallow highly-doped p-type semiconductor electrode overlying said channel region; and a plurality of amplifiers also formed in said crystalline semiconductor upper portion, said amplifiers including a plurality of JFETs, said JFETs severally comprising a gate electrode having approximately the same dopant concentration and junction depth as said shallow highly-doped p-type semiconductor electrode overlying said channel region.

BRIEF DESCRIPTION OF THE DRAWING

The present invention will be described with reference to the accompanying drawings, wherein:

FIG. 1B shows the clock phases $\phi_{RS}$, $\phi_{CL}$, and $\phi_{SH}$ used both to control the amplifier shown in FIG. 4a and also to clock the serial transfer gates 22s3, 22s2, and 22s1 of shift registers 206. The frequency $4f_{sc}$ shown at the top is the subcarrier frequency (which in this embodiment is four-thirds times the transfer frequency used in CCD chains), and is provided merely as a reference.

FIG. 2 shows plan and section views of CCD cells in the image area 212 (the top portion of the figure) and storage area 204 (the bottom portion of the figure) for one sample embodiment, namely a 488 V×774H frame transfer VPCCD image sensor with 8 MM image sensing area diagonal.

FIG. 5 shows a cross section of a sample structure for the detection node 216 preferably used in the amplifier of FIG. 4a.

FIGS. 7A–7C, show an example of a prior art method of making a CCD, in which the channel stops extend uniformly under the clocked and virtual gates.

DESCRIPTION OF THE PREFERRED EMBODIMENTS

Figure 1A:
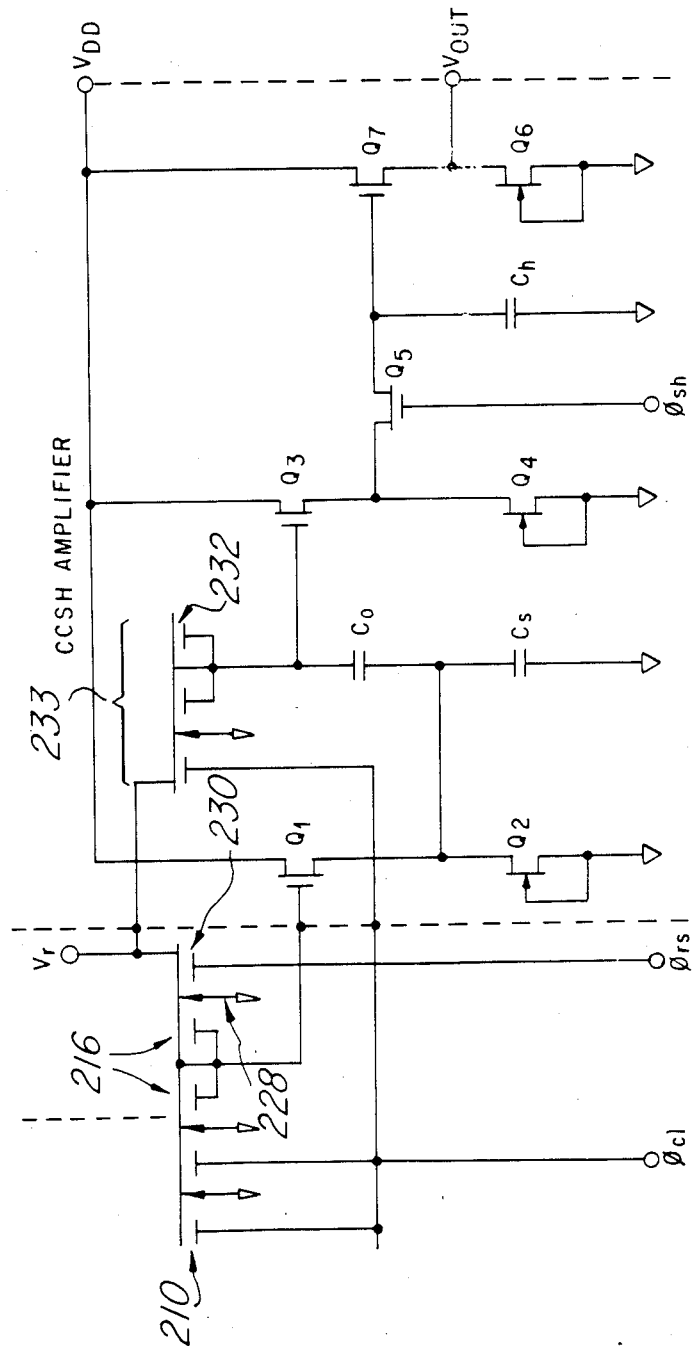
FIG. 1A shows the correlated clamp sample and hold amplifier of the presently preferred embodiment.

The process preferably used in manufacturing devices in accordance with various of the points of novelty taught by the present application will first be described in detail.

Processing

FIGS. 7A–7C shows an example of a prior art method of making a CCD. A p-type substrate 10 has an oxide 14 grown on it, and then a blanket buried channel implant forms a surface layer 12 which is n-type. (Alternatively, the surface layer 12 may be grown epitaxially instead of implanted.) An implant mask 16 is patterned to expose channel stop locations 18. P-type implantation then results in the formation of p+ channel stops 20, as shown in FIG. 7B. Finally, clocked wells are implanted, and the poly gate 22 is patterned across the lines of channel stops. The patterning of the poly gate 22 defines the location of the clocked phases along the channels.

Figure 8A:
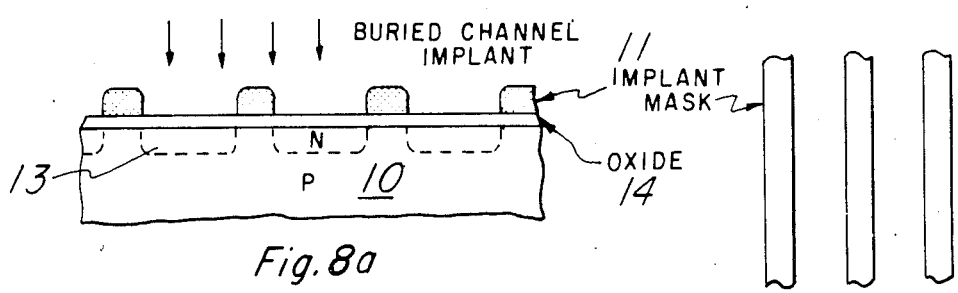
FIGS. 8A–8C show key steps in a novel method of making a CCD, using a two-mask channel definition process.
Figure 8B:
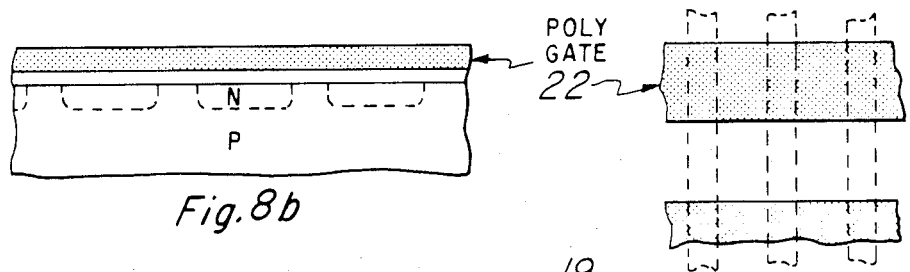
Figure 8C:
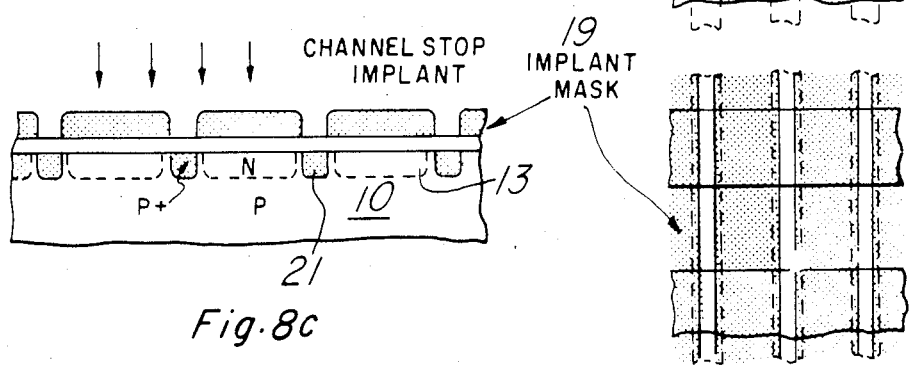
Figure 9:
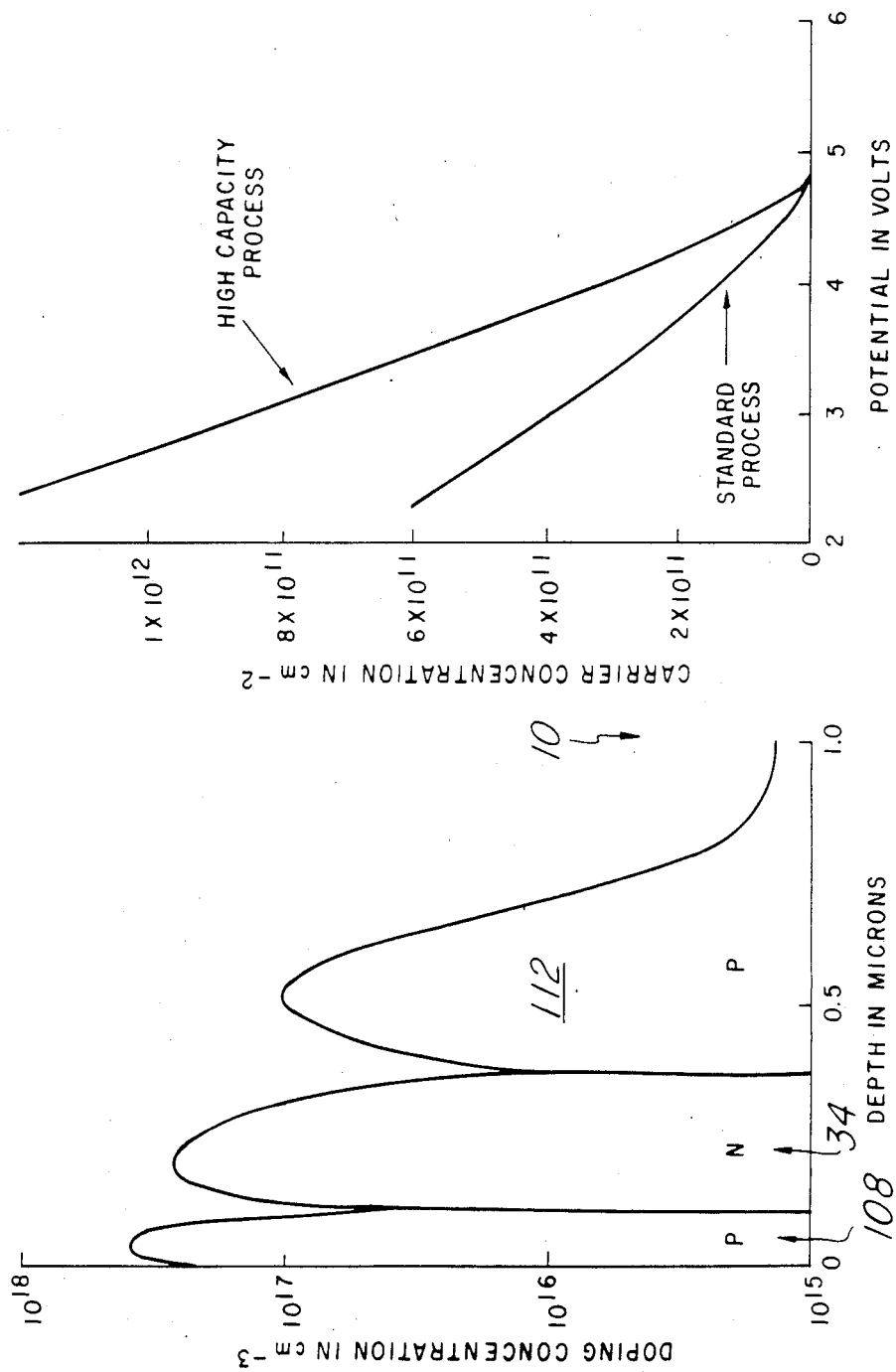
FIG. 9 shows doping profiles and the corresponding charge-potential curve for a new high-well-capacity CCD process using deep p-type regions 112 as shown in FIG. 2. A charge-potential curve for a standard process is shown for a comparison.

In the present invention, an extra mask step is added, and the order of the steps is changed, to produce substantial advantages. Key steps in the process of the present invention are shown in FIGS. 8A–8C. The first difference, as shown in FIG. 8A, is that the buried channel implant is patterned by an implant mask 11, to produce patterned channels 13 as opposed to the blanket layer 12 using the prior art. Then (after the clocked wells have been formed), the poly gate 22 is patterned, as shown in FIG. 8B. Next, a channel stop implant is screened by an implant mask 19, to produce patterned p+ channel stop regions 21 as shown in FIG. 8C.

Thus, since the channel stop implant is applied after the poly gate 22 has been patterned, the p+ channel stops 21 do not extend continuously along the full region of the channel, but are interrupted every time they are intersected by a portion of a poly gate level 22. This means that the width of the channel diffusion 13 under the poly gate 22 is increased, since there is no p+ region 21 to outdiffuse in these regions. This means that the capacity of the clocked well is increased.

To correspondingly increase the capacity of the virtual phase well, one additional (Hi-C) implant is preferably performed. This is a deep p-type implant, with a stopping distance near or below the bottom junction location which will be defined by the doping profile of the buried channel locations 13. Thus, the capacity of both virtual phase and clocked phase is increased.

The foregoing description summarizes a few of the key features which distinguish the present invention from the prior art. The fabrication process will now be discussed in great detail, with primary reference to the CCD array. Additional masks and fabrication steps may be used for fabrication of the periphery, including some which are entirely conventional in NMOS logic and will not be discussed in any great detail. Also, many minor processing steps (such as cleanups, growth of anti-Kooi-effect oxide, stripping of masks, etc.) are omitted, because they are very widely known and their insertion at appropriate points is totally obvious to anyone skilled in the art.

It should be noted that the following description gives many specific implant dose and energy specifications. These are illustrative only, provided to better permit one skilled in the art of fabricating semiconductor devices to make and use the various inventions disclosed, and do not limit the scope of the invention. In particular, the currently preferred ranges for dose and energy are given; but, as is well known to processing engineers, such specifications may be very widely varied. Many of the parameters given may be varied by plus or minus 50% ore more, depending on the tradeoffs exploited by the process engineer. As is well known, there are innumerable tradeoffs between the parameters of any one implant step and oxide thicknesses, supply voltage, annealing conditions, the parameters of other implant steps, etc. Moreover, many substitutions of technologies can be made (to name only one example, sidewall masked isolation could be used instead of LOCOS), and steps can be interchanged and modified as well.

Many parts of the specification of the present patent application have particular reference to a process which uses virtual phase CCD technology. Background on virtual phase CCD technology can be found in the following articles, all of which are hereby incorporated by reference: Hynecek, "Virtual Phase Technology: a New Approach to Fabrication of Large-area CCDs," 28 IEEE Transactions on Electron Devices 483 (1981); Hynecek, "Electron-Hole Recombination Antiblooming for Virtual-Phase CCD Imager," 30 IEEE Transactions on Electron Devices 941 (1983); Hynecek, "Design and Performance of a Low Noise Charge Detection Amplifier for VPCCD Devices," 31 IEEE Transactions on Electron Devices 1713 (1984); Hynecek, "Design and Performance of a High-resolution Image Sensor for Color TV Applications, " forthcoming in the August 1985 issue of IEEE Transactions on Electron Devices; and U.S. Pat. No. 4,229,782, which is also hereby incorporated by reference. However, many of the innovations described are perfectly applicable to other CCD technologies as well. Virtual phase technology is referred to so extensively merely because (1) it represents the currently contemplated best mode of using the various inventions described, and (2) it is often more advantageous to apply various innovations described here in the context of virtual phase technology than it would be in the context of other CCD technologies—i.e. the innovations are applicable and advantageous in many other technologies, they are simply more advantageous in virtual phase technology.

The processing sequence preferably used will now be described in great detail.

A substrate having a monocrystalline semiconductor upper portion, for example a p-on-p+ silicon wafer having a 10 micron thick epitaxial layer doped to around $1 \times 10^{15}/cm^3$ p-type, is provided as starting material.

The first masking step used is a moat masking step. This is used, as is conventional, to pattern a silicon nitride masking layer; the openings in the nitride layer expose selected regions to a LOCOS-channel-stop implant (e.g. 1E14 (this notation is conventionally used for "one times ten to the fourteenth power") per cm squared of boron at 60 keV) and then to a long oxidation, in order to form LOCOS isolation surrounding moat regions (moat regions are the regions where active devices are to be formed) in the periphery. Since no oxide isolation is needed in the CCD array, the whole array is masked from the field oxidation steps.

Next, a source/drain mask is used to mask off the entire CCD array (except for diode locations, such as the clearing diodes along the top and bottom edges of the array), so that an n+ source/drain implant can be used to form NMOS devices in the periphery. This implant may be, for example, $3 \times 10^{15}/cm^2$ to $7 \times 10^{15}/cm^2$ of phosphorus at 30–60 keV. Note that this is not a self-aligned source-drain implant, as used in most MOS processes: the virtual well implant will later be used to form source/drain extensions (LDD regions) which are self-aligned to the poly gate level. (This mask is also used to mask a plasma etch which strips the LOCOS nitride from exposed portions of the moat (in the periphery) and from the exposed portions of the CCD array. The portion of the LOCOS nitride under this mask can be removed by wet etching later.) The use of a masked source/drain implant not only provides low-resistance diffused interconnects and LDD structures (which reduce hot-electron problems), but also is advantageous if JFET devices are used in the periphery: the masked source/drain implant means that the JFET channel regions can be screened from this implant. Instead of implanting, this step of introducing dopants may be performed as a POCl3 deposition step instead.

Next, implant mask 11 is patterned to expose the CCD channel regions, and an implant of $1 \times 10^{12}/cm^2$ to $2 \times 10^{12}/cm^2$ of phosphorus at 100–150 keV is applied to form buried channel regions 13, as shown in FIG. 12a.

Next an arsenic implant of $2 \times 10^{14}/cm^2$ to $4 \times 10^{14}/cm^2$ at 20–30 keV is applied to form clocked wells.

Figure 12:
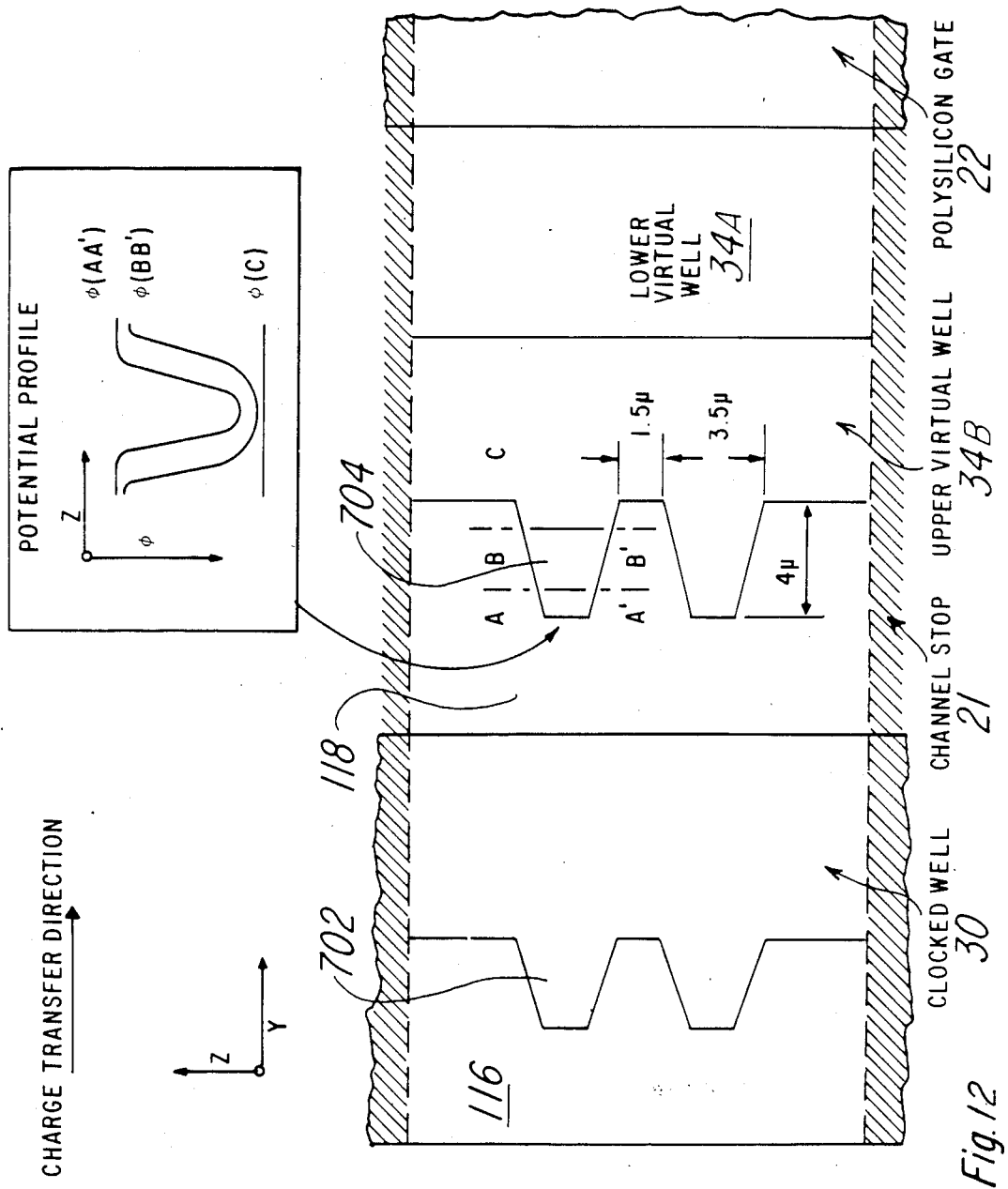
FIG. 12 shows a plan view of the implant masking used, in an alternative class of embodiments which is particularly attractive where pixel spacing is more than 20 microns, to achieve a graded profile of the potential energy for electrons within each CCD pixel, to promote higher charge transfer efficiency.
Figure 13:
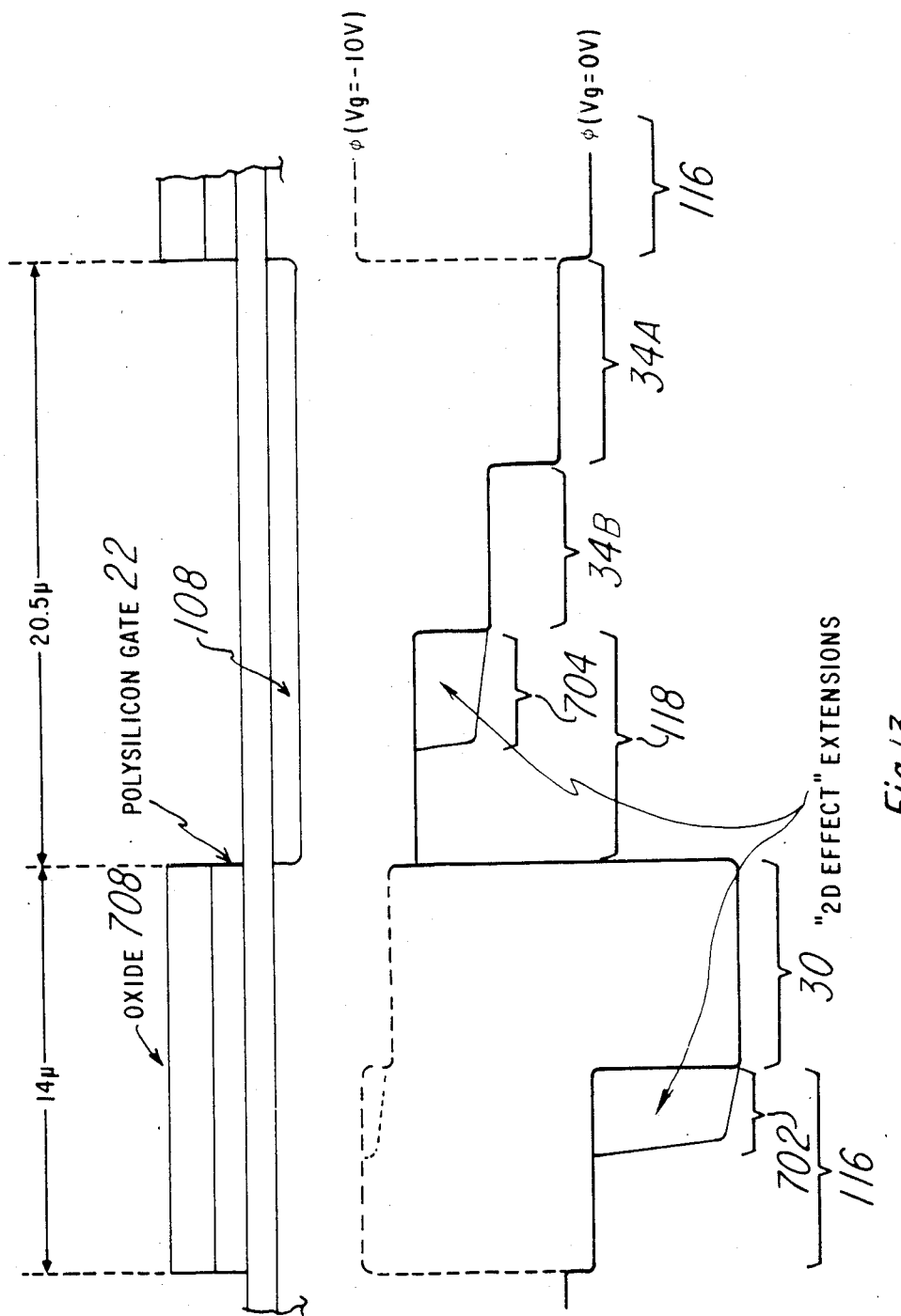
FIG. 13 shows an example of the potential energy profiles.

An alternative class of embodiments can be provided by a modification to this step of the process. FIG. 12 shows a plan view of the wedge-shaped extensions 702 which can be used with the clocked well masking. This alternative class of embodiments is particularly attractive where pixel spacing is more than 20 microns, to achieve a graded profile of the potential energy for electrons within each CCD pixel; such a graded profile promotes higher charge transfer efficiency in large devices. FIG. 13 shows an example of the potential energy profiles which are achieved by this structure.

That is, in large dimension CCDs, the transport of carriers within a large well region will be limited by carrier diffusion statistics except where the carriers are close to the potential gradient at the boundary between the well and the barrier of the succeeding phase. This carrier diffusion process imposes a trade-off between clock frequency and charge transfer efficiency, but it is highly undesirable (particularly in a frame transfer device) to have to make any compromise in either of these parameters. Thus, it has been recognized as desirable, in the prior art, to introduce some potential energy gradation within the wells, to accelerate complete transfer of the carriers to the well boundary when the barrier of the adjacent phase is brought to a lower potential energy.

This can be a problem in the array of large CCDs, but it can also be a particular problem in the multiplexing and serial register portions of CCDs as small as (for example) an 11 mm diagonal (488 by 780 pixels) device with three serial registers, where the pitch of each serial register corresponds to three times the horizontal pitch of the array.

Prior art methods of accomplishing this have used multiple implants, but of course each extra implant requires an extra mask level, so that this has been tremendously expensive in terms of processing complexity. A novel way to accomplish this is by the use of two-dimensional potential effects; such effects are known, but the application of them to achieve potential gradation within a single well region in a CCD is believed to be novel. That is, among the novel teachings in this application is that potential gradients within a well can be achieved merely by geometrical modifications to the mask geometries of the patterned implants which already require masking steps, without any requirement for use of additional masking steps.

In the embodiment shown in FIG. 12, the shape of clocked well 30 is modified to include wedge-shaped extensions 702. The virtual well region 34 shown in FIG. 2 is split, in the embodiment of FIG. 12, into two portions, an upper virtual well 34B and a lower virtual well 34A, where the upper virtual well 34B has a potential energy intermediate between that of the lower virtual well 34A and that of the virtual barrier 118. (One extra mask is required to accomplish this.) Moreover, the upper virtual well 34B is patterned to include wedge-shaped extensions 704 protruding into the virtual barrier 118, and the potential profiles at the top of FIG. 12 show the lateral variation in potential across these wedges along the marked sections A through C. That is, the device structure shown effectively provides two regions of intermediate potential in the virtual phase: one is the "upper virtual well" 34B, which provided in the conventional way at the cost of a mask; but the other is provided by the wedge-shaped extensions, which effectively provide an additional intermediate potential region without requiring an additional masking step. The "upper virtual well" 34B can alternatively be thought of as a lower barrier region, since any charge transferred into upper virtual well 34B will all be collected in the lower virtual well 34A anyway.

FIG. 13 shows potential profiles for the regions of FIG. 12. Note that the potential profiles for the clocked portions 116, 702, and 30 are shown for both states of the polysilicon clocked electrode 22.

However, the embodiment of FIG. 13 and FIG. 12 is not the principal preferred embodiment, and discussion of the principal preferred embodiment will now resume.

Next, gate oxide 14 is grown on all exposed areas of silicon, to a thickness of, for example, 700 Å, and poly gate 22 is patterned.

Next, a channel stop implant mask 19 is used to expose channel stop regions 21 to a p-type implant, for example, $1 \times 10^{13}$/per $cm^2$ to $5 \times 10^{13}$/per $cm^2$ of boron at 100–200 keV.

Next, a virtual well implant, for example $1.3 \times 10^{12}$/$cm^2$ of phosphorus at 200 keV, is performed into areas 34. As discussed above, if it is necessary to create potential gradients within some or all of the virtual wells, the mask for this implant step may be modified to include wedge-shaped extensions, and the mask itself may be split, i.e. an additional mask level may be used to separately pattern both an upper virtual well and a lower virtual well. However, use of this additional mask is not presently preferred.

Next, a blanket virtual barrier implant, for example $1.4 \times 10^{12}$/$cm^2$ of phosphorus at 300 keV, is preferably performed overall.

The virtual well, virtual barrier, and channel stop implants can be performed in any order. However, one useful and novel teaching of the present application is that the channel stop implant should be patterned after the poly gate 22 has been patterned.

Next, a deep p-type implant, for example $2 \times 10^{12}$/$cm^2$ of boron at 200 keV or more, is preferably performed. This implant functions as a "Hi-C" implant to increase the capacity of the virtual well locations. This implant is not masked in the array, but may be masked in the periphery to provide control over the turnoff characteristics of the JFET devices and avoid degrading the diode breakdown of the n+ source/drain diffusions.

It is preferable that the gate level 22 be thick enough to stop this implant and the channel stop implant. However, stopping boron at more than 100 keV requires a significant thickness of polysilicon, and this conflicts with another goal: to boost quantum efficiency, it is desirable to have the polysilicon gate 22 thin enough to be partially transparent, so that at least some photocarriers can be collected in the clocked wells (in addition to the virtual wells) during the frame exposure period of the imaging array. This will not be practical unless the gate 22 is reasonably thin, e.g. half a micron or less.

To avoid this dilemma, a further novel teaching of this application is that the gate structure should include a thick transparent oxide (not shown) overlying the polysilicon 22. This layered structure is patterned by conventional stack-etching methods. For example, the gate may be polysilicon 2000 Å to 3000 Å thick and doped to a sheet resistance of around 20 to 100 ohms per square, and the transparent oxide may be CVD or plasma oxide, and be at least 2000 Å to 5000 Å thick. In future embodiments it may be desirable to scale the poly layer 22 down to 500 Å thick. Reducing the thickness of the poly increases its transparency and assists in collecting photocarriers in the clocked wells during the exposure interval, thereby raising the quantum efficiency.

Next, a high-dose low-energy boron implant (which also is blanket in the array, but selectively masked in the periphery) is used to form the virtual phase electrode. This step also forms the gates of JFETs in the periphery. This implant may be, for example, $6 \times 10^{12}$/$cm^2$ of boron at 35 keV. As shown in FIG. 10B, the virtual phase implant creates the JFET gate 36. The JFET channel region 38 is created by the virtual well and virtual barrier implants.

Figure 10A:
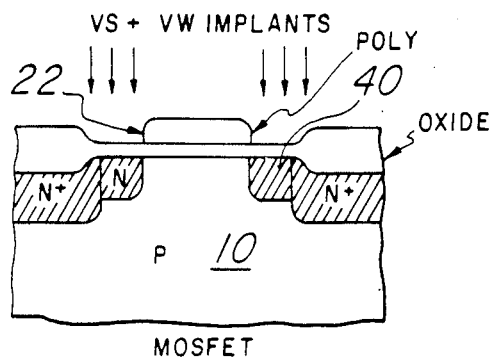
FIG. 10A shows how the combination of virtual barrier and virtual well implants creates n-type source/drain extension regions (LDD regions) 40 in the MOSFET devices in the periphery.
Figure 10B:
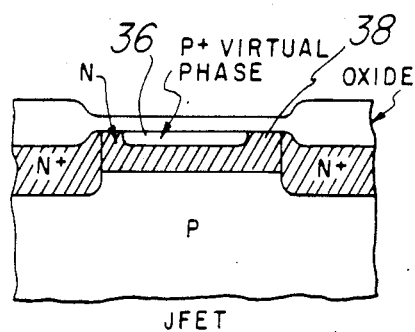
FIG. 10B shows how the virtual phase electrode implant also forms the gates of JFET devices in the periphery.

In the MOSFET devices in the periphery, as shown in FIG. 10A, the combination of virtual barrier and virtual well implants creates n-type source/drain extension regions (LDD regions) 40.

One advantage of the process of the present invention is that it creates both surface channel MOSFETs and buried channel MOSFETs. (The surface channel MOSFETs are enhancement-mode devices, and the buried channel MOSFETs are depletion-mode devices.) To create the buried channel MOSFETs, the moat region in the periphery is exposed to the buried channel implant (a light-dose phosphorus implant, which is performed before the poly gate level is patterned.) The use of buried channel devices has circuit advantages, as will be discussed below. To create the surface channel MOSFETs, the moat regions in the desired surface channel device locations are blocked from the buried channel implant. Other implanting steps may also be used to adjust the threshold voltages of the active devices, as is customary in NMOS (or CMOS) processing.

Figure 11:
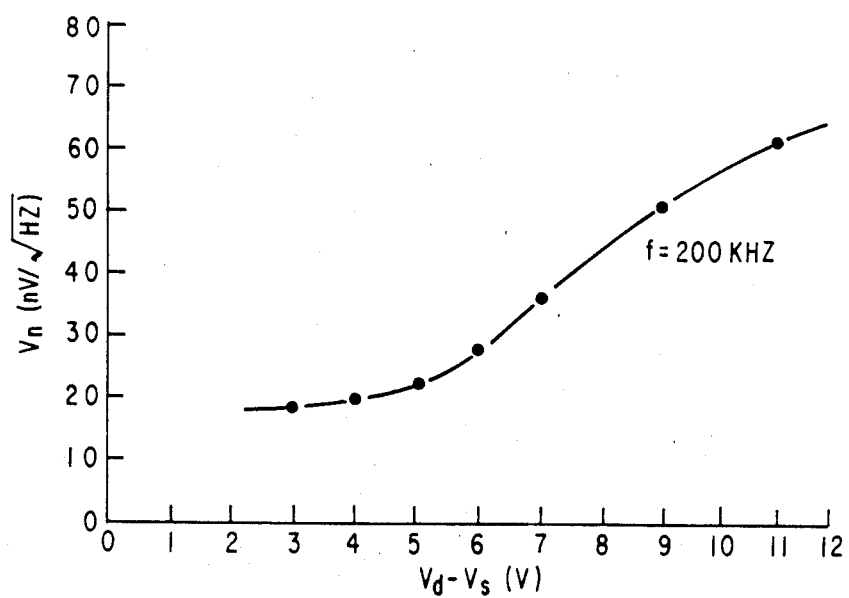
FIG. 11 shows a plot of noise spectral density at 200 kilohertz vs. drain voltage.

Buried-channel MOSFETs give good low-noise performance, but only as long as their drain voltage is kept sufficiently low. A plot of noise spectral density at 200 kilohertz vs. drain voltage can be seen in FIG. 11.

When a buried-channel device is biased above saturation, hot electrons are believed to be generated in the channel, and will produce additional electron-hole pairs through impact ionization. In a buried-channel transistor, some of the generated holes will be confined in the potential well between the bulk channel and the silicon-silicon dioxide interface. The holes must then travel along the interface from the drain region to the vicinity of the source and finally to the substrate or along the side of the gate to the channel stops. If enough holes accumulate at the interface, the threshold voltage of the transistor will shift, and a drain current increase will be observed. This phenomenon becomes more acute as transistor gate width is increased, and it is also exacerbated by the potential barriers for holes which sometimes exist at the edge of the buried channel next to the thick field oxide region.

To avoid this noise problem of buried-channel devices, while retaining the good low-noise small-signal characteristics of such devices, the present invention teaches combination of surface-channel MOS transistors with buried-channel MOS transistors in CCD peripherals. The surface-channel transistor can be correctly biased for high output current levels by the levels provided from preceding low-noise buried-channel stages, using a common drain supply voltage (VDD) for both surface-channel and buried-channel devices. That is, the surface-channel MOS output stage permits the use of low-noise buried channel devices in the small-signal stages, but avoids the necessity of biasing the buried-channel transistors into their high-noise regime for driving the output stage. The combination of the buried-channel and surface-channel transistors thus offers lower drain bias requirements, lower power consumption, lower output DC voltage, and, most importantly, superior noise performance.

With the processing parameters used in the presently preferred embodiment discussed here, the surface channel devices will have a threshold voltage in the range of 0 to 0.5 volts. The drain voltage (VDD) supply is preferably in the neighborhood of 12 volts, and the surface channel output device is biased to a gate voltage in the neighborhood of 8 volts. Since the DC output voltage is about 5 volts (this is determined by the dimensions of the load transistor), the voltage from gate to source is in the neighborhood of 3 volts. The buried channel devices will have threshold voltages in the range of −6 to −7 volts, again at about 12 volts VDD supply, and the gate to source voltage is in the neighborhood of −3 volts (i.e. the gate is biased about 3 volts into the on regime).

Figure 6:
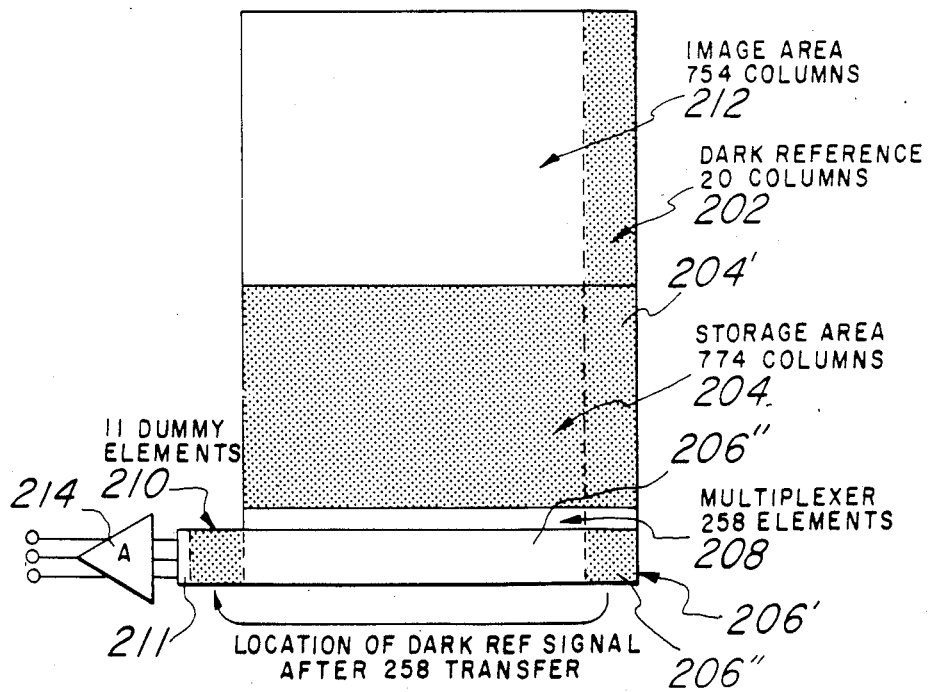
FIG. 6 show the relative locations of serial shift registers 206, multiplexer 208, and dummy elements 210 (in which the dark reference signal generated at the right edge of the image sensing area is stored during horizontal blanking interval), together with the image area 212.

Processing continues with other conventional NMOS processing steps used for fabrication of the periphery, including metal patterning, contact patterning, and (if needed) second poly. Of course, an opaque protective overcoat cannot be used over the imaging array area; instead of the usual compressive nitride protective overcoat, an oxide overcoat is preferably used. The metal level, in addition to its interconnect functions, is preferably patterned to cover the dark reference area 202 and storage area 204, and may optionally (if not needed for interconnect) also be used to cover serial shift registers 206, multiplexer 208, and dummy elements 210. (The relative locations of these elements, together with image area 212, are shown in FIG. 6.)

FIG. 2 shows plan and section views of CCD cells in the image area 212 (the top portion of the figure) and storage area 204 (the bottom portion of the figure). In the image area 212, the poly level 22 is used not only to form the gates of the cells but also to form antiblooming gates 22'. During the virtual phase, i.e. when all the signal charge should be in virtual well locations if it is not overflowing due to blooming, the antiblooming gate can be briefly clocked negative to charge up interface states beneath its oxide with holes (accumulated from the virtual electrode and from the substrate). The antiblooming gate can then be clocked positive to collect stray electrons, which recombine with the holes stored in the interface states. Antiblooming operation is discussed in much greater detail in Hynecek, 30 IEEE Transactions on Electron Devices page 941 (1983), which is hereby incorporated by reference.

The process discussed has created channel regions 13, which are separated by channel stops 21 outside of the poly gate locations 22, and by the background doping of the substrate 10 underneath the poly gates 22. Underneath each poly gate 22 is a clocked barrier 116 and a clocked well 30. The clocked well 30, created by a patterned arsenic implant as discussed above, creates a localized space charge from the ionized implanted arsenic atoms. (In the diagram of FIG. 2, all implants are shown by their net space charges, i.e., p-type implants are shown as negative charges and n-type implants are shown as positive charges.) Underneath the virtual phase electrode 108 (which is created by a blanket boron implant, as discussed above) are virtual barrier portions 118 and virtual well portions 34 (as mentioned above, the virtual well portions 34 are preferably created by a patterned phosphorus implant, and a blanket phosphorus implant is preferably used to create the virtual barrier 13.) (Note that, in the image area 212, the antiblooming gate 22' separates the virtual barrier region 118 from the virtual well region 34.) A deep blanket p-type implant 112 is also preferably used under the virtual well implant, to enhance its capacitance. Since this implant is preferably performed as a blanket implant, it also increases the concentration of the p-type substrate directly underneath the virtual barrier regions.

The CCD array organization which makes use of the processing steps and device structures discussed above will now be described.

Output Structures

Figure 4:
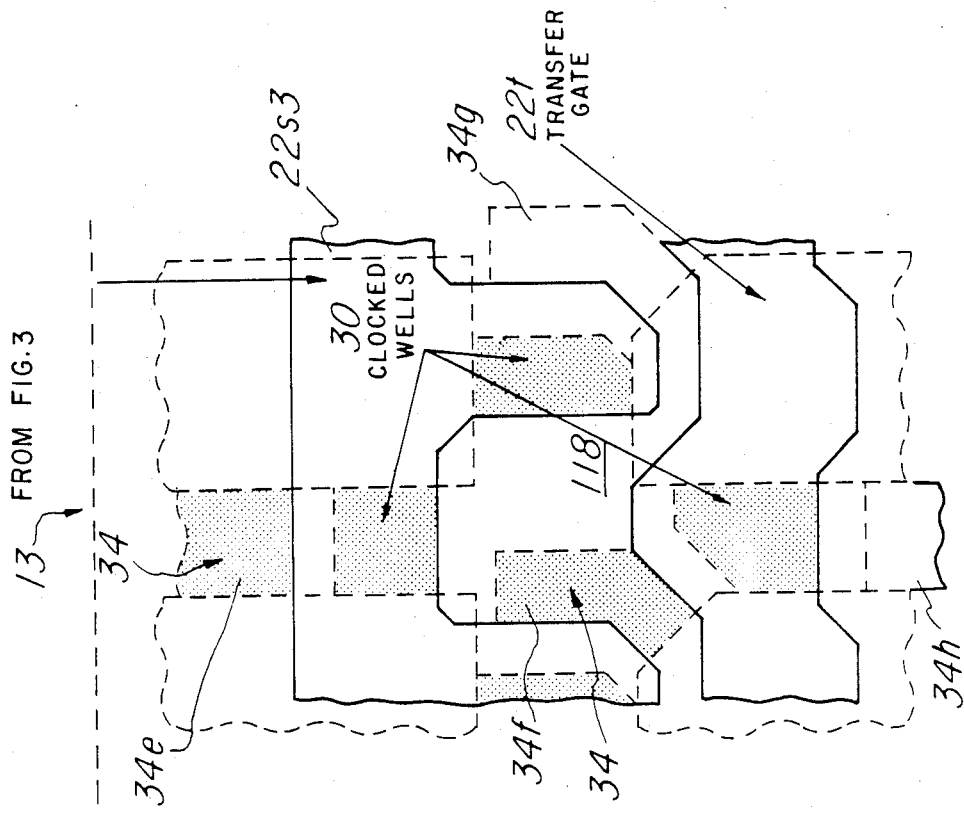
FIGS. 3 and 4 show how the vertical columns of CCD elements (like those shown in FIG. 6) which extend through the image area 212 and storage area 204 are connected at the bottom end of the two arrays.
Figure 3:
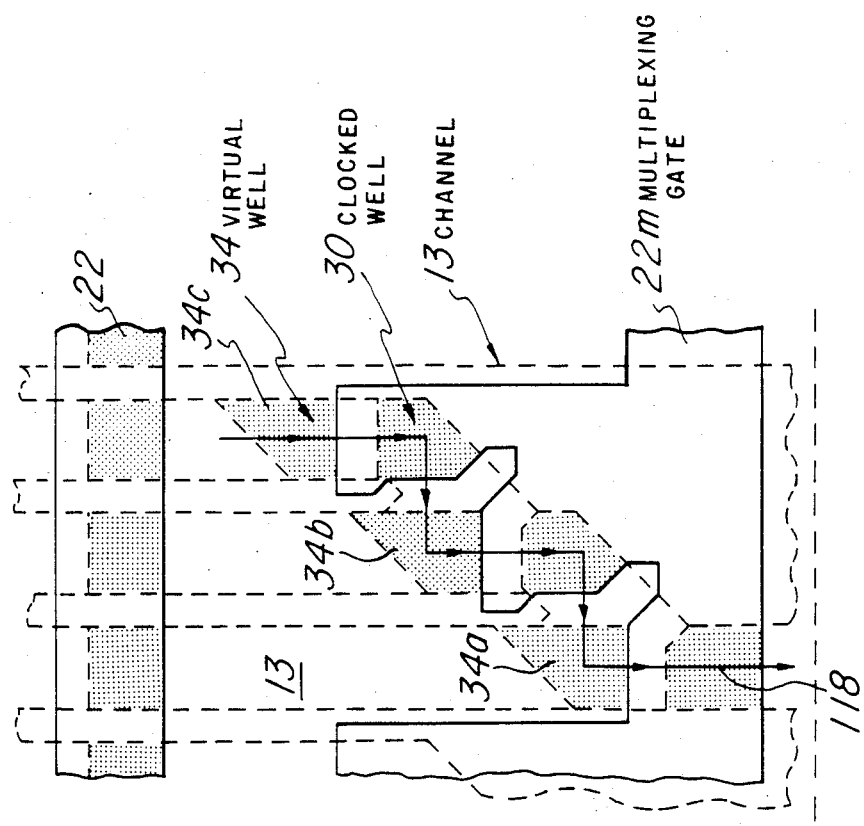

Thus, vertical columns of CCD elements as shown in FIG. 2 extend through the image area 212 and storage area 204. At the bottom end of the two arrays, these columns of CCD elements are connected as shown in FIGS. 3 and 4. The gate 22 shown is the last gate in a series of gates such as that shown in the bottom of FIG. 2. Thus, when one line is being transferred from the storage area 204 into the serial shift registers 206, this gate is clocked to transfer charge packets from the three channels shown into the virtual wells 34 between it and the multiplexing gate 22M. The multiplexing gate 22M is then clocked to transfer charge from virtual well 34a to virtual well 34e at the top of FIG. 4. The same clocking operation transfers charge from well 34b to well 34a, and from well 34c to 34b.

FIG. 4 shows one serial shift gate 22s3 and one parallel transfer gate 22t. As will be seen from the shown configuration of clocked wells 30 and virtual wells 34, when the serial transfer electrode 22s3 is clocked it will not only transfer charge from virtual well 34e to virtual well 34f, it will also transfer charge from well 34g to well 34f. That is, this gate 22s3, which is the gate of the serial shift register, performs both serial clocking and parallel transfer. The transfer gate 22t will transfer charge in parallel from well 34f (and all the wells corresponding to it) to another row of wells 34h. These wells 34h are adjacent to another serial transfer gate 22s2, not shown; the wells 34h are positioned with respect to serial transfer gate 22s2 approximately as wells 34e are positioned with respect to transfer gate 22s3.

Note that, as charge is being clocked along the serial transfer gate 22s3, it sees a virtual barrier 118 which is wider than the virtual well 34. As may be seen from comparison with FIG. 2, this is not the same as the relative sizing used in the CCD array. These wider barriers assist in achieving good timing and charge transfer efficiency in both of the two possible directions of charge transfer (serial and parallel).

Three transfer gates like 22s3 are preferably used, to separate the three colors of the imager. (To correspond to this separation, color filter strips are preferably overlaid on the individual channels of image area 212, so that, for example, well 34a has collected information from a red pixel site, well 34b has now collected information from a green pixel site, and well 34c has collected information from a blue pixel site.)

Thus, at the bottom of the storage array there will typically be a multiplexing gate, a first serial shift register gate 22s3, a first parallel transfer gate 22t, a second serial shift register gate 22s3, a second parallel transfer gate 22t, a third serial shift register gate 22s3, and a third parallel transfer gate 22t. Of course, more or less than three colors may be used: four colors could be implemented by using four color strips over the imaging area, and a fourth serial register 22s4 together with a fourth amplifier.

The third parallel transfer gate 22t is an optional feature, which can be used to shift charge out of the third serial shift register 22s1 into an n+ drain diffusion (not shown). This n+ drain diffusion can be used to clear stray charge out of the whole array at power-up, without the delay of clocking charge serially through the output amplifier. Another n+ drain diffusion (not shown) is preferably located next to the first CCD element in each column at the top of the array; these two drain diffusions both serve to collect stray charge (photocarriers) which might otherwise diffuse into the array to cause high noise in pixels near the edge. A further related feature is two guard columns at the edge of the array: these columns have their wells and barriers patterned oppositely to the other adjoining columns, so that when the array lines are clocked these columns do not transfer charge down to the registers 22s3 etc, but instead transfer their charge into the top n+ drain. This prevents diffusing carriers from causing a spike in dark current at the first and last pixels of each line, which would cause difficulties in subsequent signal processing.

Thus, after serial clocking has emptied the shift registers 206 (i.e., the wells 34e through 34h are all essentially empty), the lines 22 in the storage area 204 are all clocked, so that one line of charge is transferred into the wells 34a, 34b, and 34c above the multiplexing gate 22M. The multiplexing gate 22M is clocked once, to transfer charge from well 34a to well 34e, and serial electrode 22s3 is then clocked to transfer that same charge packet to well 34f. Next, the multiplexing gate 22M is clocked again to transfer the charge packet which was previously in well 34b and is now in well 34a, into well 34e, while transfer gate 22t is clocked at the same time, to transfer the charge which was originally in well 34a into well 34h. By repetition of this operation, the shift register gates 22s3, 22s2, and 22s1 (not shown) are loaded with the charge packets corresponding to the separated colors from the line of information which was just transferred out. The serial transfer gates 22s3, 22s2, and 22s1 are now clocked (while the parallel transfer gates 22t are not clocked) to transfer these charges out through the output amplifiers 214.

Preferably the serial transfer gates 22s3, 22s2, and 22s1 of shift registers 206 are clocked using phases $\phi_{RS}$, $\phi_{CL}$, and $\phi_{SH}$ as shown in FIG. 1B. These same clock phases are also used, in the preferred embodiment, in the output amplifiers 214, as will now be discussed.

FIG. 1A shows the correlated clamp sample and hold amplifier of the presently preferred embodiment.

Note that the ends of the second serial shift register 206 include dummy elements 210. These dummy elements 210 are gated by the serial transfer gates 22s3, 22s2, and 22s1, but the parallel transfer gates 22t need not be included in this portion of the shift registers 206. Each of these shift registers ends in a detection node, as shown on FIG. 4a.

Figure 5:
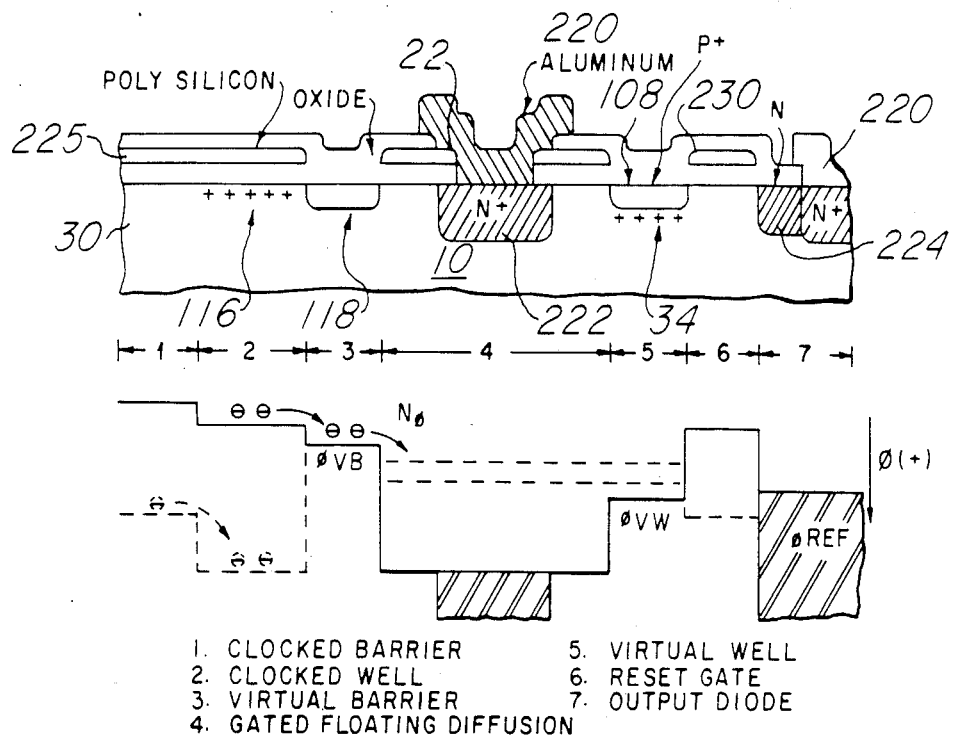

A cross section of a sample structure for this detection node 216 is shown in FIG. 5. The clocked barrier 30 and clocked well 116 are at the end of serial shift register gate 22s1 (or 22s2 or 22s3). By clocking the poly gate 22s1, charge is transferred from clocked well 116 over virtual barrier 118 into the capacitor defined by diffusion 222 and the portion of poly plate 22 and aluminum contact 220 which are tied to it. This node has a reasonably linear charge-voltage relationship, corresponding to a very small capacitance. That is, in this node the gate is shorted to the channel, so that only a small channel-to-substrate capacitance remains for the charge storage. The function of this detection node can also be considered in another way: due to its small capacitance it is an efficient quasi-Fermi-level detector for the charge which is almost entirely stored in virtual well 34.

The n+ diffusion 222 is formed by the source/drain implant: the lightly doped drain extension regions, such as region 224 shown in FIG. 5, are preferably provided by exposure to both the virtual well and virtual barrier implants. Thus, in peripheral NMOS transistors, lightly doped drain extensions 224 are self-aligned to the gate, and the source/drain n+ diffusions 222 need not be.

The diagram of FIG. 1A schematically shows each CCD elements as an MOS gate (the clocked gate) followed by a grounded JFET gate (the virtual phase gate). Note that the reset voltage $V_r$ is also connected to detection node 216 through a CCD structure: the clock phase $\phi_{RS}$ is clocked to transfer charge through a virtual phase node 228 to the detection node 216. The reset gate 230 and/or the virtual phase gate 228 are preferably configured to introduce a certain resistance at this point. This can be done by narrowing the patterned channel in this region, or by lengthening the LDD region 224, to introduce more series resistance.

Thus, initially the detection node 216 is reset to approximately a reset voltage $V_r$. Detection node 1 is also connected to gate a source follower stage including transistors Q1 and Q2.

Q1 is preferably a buried channel MOSFET having width of 9 microns and length of 6 microns. Q2 is preferably a JFET having a channel length of 30 microns and a gate width of 6 microns. The very low W/L ratio of this first stage load is used because this device is a high-pinchoff device, i.e. its pinchoff voltage would be in the neighborhood of 4 volts; use of a high-pinchoff JFET here reduces the JFET's noise contribution, but its length has to be greater than its width to keep its current low.) The output of this first source follower stage is connected to the node between capacitor $C_o$ and $C_s$. The channel length can be varied within the range of 3 to 100 microns, or even wider if appropriate process modifications are used, as is well known to those skilled in the art.

Capacitor $C_s$ has the effect of low-pass filtering of the output of the source follower stage which includes Q1: as is well known, less amplifier bandwidth means lower total noise power.

After the reset phase, the clamp phase clock $\phi_{CL}$ is clocked, and, on the falling edge of this clock, a signal charge packet is transferred from CCD register into first detection node 216. This phase is also connected to gate a short CCD channel which provides a dummy element, namely second detection node 232.

The second detection node 232 has essentially the same construction as the first detection node 216, but has slightly larger dimensions. That is, the detection node 232 includes an n+ diffusion 222 which is shorted to a poly capacitor plate, and is separated from the reset voltage supply $V_r$ by a CCD element (both clocked phase and virtual phase, i.e. both MOS and JFET active elements).

Thus, during clock phase $\phi_{clamp}$ ($\phi_{cl}$), the gate of transistor Q3 will see a voltage corresponding to the reset voltage on second detection node 232, but this reset voltage will include less noise than the reset voltage generated on first detection node 216, since second detection node 232 is not only larger but also is connected to large capacitor $C_o$, so that the kT/C noise component is reduced. On the falling edge of the $\phi_{clamp}$, capacitor $C_o$ will pass the output of Q1 through to the gate of Q3, except that the noise component of Q1's output will be partially damped and added to the low-noise reset voltage level already present on Q3's gate (damping is accomplished by the shunt path to ground provided by $C_s$, which provides low-pass filtering of the signal provided to Q3).

The second buffer amplifier preferably includes the buried channel MOSFET Q3 which is 30 microns wide and 6 microns long, together with a JFET current source Q4 which has 20 microns channel width and 12 microns gate length. On clock phase $\phi_{sh}$, the output voltage of the second source follower stage is sampled by transistor Q5 and held on large capacitor $C_h$ to drive the final source follower stage including transistors Q6 and Q7.

Note that JFET load Q4 is not a high-pinchoff device like Q2, but instead is a low-pinchoff device, with a pinchoff voltage in the neighborhood of 2 volts.

An advantage of the process of the present invention is that it does provide two kinds of JFETs, and, as the foregoing example shows, this is advantageous to circuit designers: long high-pinchoff devices can be used for loads where special low-noise performance is required, and low-pinchoff devices can be used elsewhere.

This is controlled by the masking of the virtual well and virtual barrier implants: the high pinchoff devices are exposed to the virtual well implant, and the low-pinchoff devices are exposed to the virtual barrier implant.

Transistor Q7 is preferably a surface channel MOSFET, not a buried channel device like transistors Q3 and Q1, and has a width of 200 microns and a length of 6 microns. Transistor Q6 is another JFET load, and preferably has channel width of 120 microns and gate length of 12 microns. Of course, the specific device dimensions given here may be widely varied, and are provided simply to illustrate as clearly as possible the best mode of the invention as presently contemplated.

As will be recognized by those skilled in the art, the present patent application teaches numerous broadly applicable concepts in CCDs. These concepts may be embodied in a tremendous variety of device, processing, and system embodiments, and the scope of the present invention is accordingly not limited except as specified in the claims.

What is claimed is:

1. A charge coupled device (CCD) comprising:
   a substrate having a p-type crystalline semiconductor upper portion containing a plurality of CCD elements connected in series, each said CCD element comprising an insulated-gate phase portion and a diffused-gate phase portion,
   each of said insulated gate phase portions and each of said diffused-gate phase portions including both a well region and a barrier region,
   said well regions of said diffused-gate phase portions comprising both an n-type channel region and a shallow highly-doped p-type semiconductor electrode overlying said channel region: and
   a plurality of amplifiers also formed in said crystalline semiconductor upper portion, said amplifiers including a plurality of junction field effect transistors (JFETs) said JFETs severally comprising a gate electrode having essentially the same dopant concentration and junction depth as said shallow highly-doped p-type semiconductor electrode overlying said channel region.

2. The device of claim 1, wherein at least some of said JFETs are high-pinchoff devices.

3. The device of claim 1, wherein at least some of said JFETs have a pinchoff voltage greater than three volts.

4. The device of claim 1, wherein at least some of said JFETs are connected as loads in source-follower amplifier stages and have a pinchoff voltage greater than three volts.

5. The device of claim 1, wherein at least some of said JFETs are connected as loads in source-follower amplifier stages and have a pinchoff voltage significantly greater than three volts, and others of said JFETs are also connected as loads in source-follower amplifier stages and have a pinchoff voltage significantly less than three volts.

6. A charge coupled device (CCD) comprising:

a substrate having a p-type crystalline semiconductor upper portion containing a plurality of CCD elements connected in series, each said CCD element comprising an insulated gate phase portion and a diffused-gate portion;

each of said insulated gate phase portions and each of said diffused-gate phase portions including both a well region and a barrier region;

said well regions of said diffused-gate phase portions comprising both an n-type channel region and a shallow highly-doped p-type semiconductor electrode overlying said channel region;

said insulated gate phase portions comprising an insulated gate electrode at the surface thereof; and a plurality of amplifiers also formed in said crystalline semiconductor upper portion;

said amplifiers including a plurality of junction field effect transistors (JFETs), said JFETs severally comprising a gate electrode having approximately the same dopant concentration and junction depth as said shallow highly-doped p-type semiconductor electrode overlying said channel region;

and said amplifiers also including a plurality of insulated gate field effect transistors, said insulated gate field effect transistors severally comprising an insulated gate electrode having approximately the same structure as said insulated gate electrode at the surface of said insulated gate phase portions;

wherein some of said insulated gate field effect transistors are buried-channel devices, and others of said insulated gate field effect transistors are surface-channel devices.

7. The device of claim 6, wherein at least some of said JFETs are high-pinchoff devices.

8. The device of claim 6, wherein at least some of said JFETs have a pinchoff voltage greater than three volts.

9. The device of claim 6, wherein at least some of said JFETs have a pinchoff voltage significantly greater than three volts and are connected together with at least some of said buried-channel transistors to provide source-follower amplifier stages.

10. The device of claim 6, wherein at least some of said JFETs have a pinchoff voltage significantly less than three volts and are connected together with at least some of said buried-channel transistors to provide source-follower amplifier stages, and others of said JFETs have a pinchoff voltage significantly greater than three volts and are connected together with at least some of said surface-channel transistors to provide other source-follower amplifier stages.

* * * * *